(12) United States Patent
Ogiso et al.

(10) Patent No.: US 10,083,893 B2
(45) Date of Patent: Sep. 25, 2018

(54) SEMICONDUCTOR DEVICE AND SEMICONDUCTOR DEVICE MANUFACTURING METHOD

(71) Applicant: Toshiba Memory Corporation, Minato-ku (JP)

(72) Inventors: Koji Ogiso, Oita (JP); Kazuyuki Higashi, Oita (JP); Tatsuo Migita, Oita (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 14 days.

(21) Appl. No.: 14/482,395

(22) Filed: Sep. 10, 2014

(65) Prior Publication Data

US 2015/0214134 A1    Jul. 30, 2015

(30) Foreign Application Priority Data

Jan. 30, 2014  (JP) ................... 2014-015829
Jan. 30, 2014  (JP) ................... 2014-015988

(51) Int. Cl.
*H01L 23/48*   (2006.01)
*H01L 21/768*  (2006.01)

(52) U.S. Cl.
CPC ...... *H01L 23/481* (2013.01); *H01L 21/76898* (2013.01); *H01L 2224/0557* (2013.01); *H01L 2224/13009* (2013.01)

(58) Field of Classification Search
CPC .................. H01L 23/481; H01L 21/76898
See application file for complete search history.

(56) References Cited

U.S. PATENT DOCUMENTS

| 6,103,585 | A   | * | 8/2000  | Michaelis | ......... H01L 21/30655 |
|           |     |   |         |           | 257/E21.008              |
| 6,683,000 | B2  | * | 1/2004  | Fukui     | ............... H01L 21/76882 |
|           |     |   |         |           | 257/E21.588              |
| 7,956,293 | B2  |   | 6/2011  | Echigo et al. | |
| 8,258,010 | B2  |   | 9/2012  | Pagaila et al. | |
| 2002/0179570 | A1 | * | 12/2002 | Mathad | ............... H01L 21/3065 |
|           |     |   |         |           | 216/67                    |

(Continued)

FOREIGN PATENT DOCUMENTS

CN    1592965 A    3/2005
JP    2002-319586 A    10/2002

(Continued)

OTHER PUBLICATIONS

Office Action dated Sep. 17, 2015 in Taiwanese Patent Application No. 104100082 (with English language translation).

(Continued)

*Primary Examiner* — Moazzam Hossain
(74) *Attorney, Agent, or Firm* — Oblon, McClelland, Maier & Neustadt, L.L.P.

(57) ABSTRACT

According to an embodiment, a semiconductor device is provided. The semiconductor device includes a through-hole, a copper layer, and a metal portion. The through-hole penetrates a semiconductor substrate between front and rear sides. The copper layer is formed inside the through-hole. The metal portion is made of a metal other than copper, formed closer to a hole core side of the through-hole than the copper layer is, and involves a void therein.

21 Claims, 13 Drawing Sheets

(56) References Cited

U.S. PATENT DOCUMENTS

| | | | |
|---|---|---|---|
| 2006/0024966 A1* | 2/2006 | Umemoto | H01L 21/76898 438/689 |
| 2007/0184654 A1 | 8/2007 | Akram et al. | |
| 2008/0246068 A1* | 10/2008 | Cheng | H01L 27/10829 257/301 |
| 2008/0315422 A1 | 12/2008 | Boyd et al. | |
| 2009/0140395 A1 | 7/2009 | Davis et al. | |
| 2009/0280643 A1 | 11/2009 | Andry et al. | |
| 2010/0038778 A1* | 2/2010 | Lee | H01L 21/76898 257/737 |
| 2010/0237471 A1 | 9/2010 | Pagaila et al. | |
| 2011/0193241 A1* | 8/2011 | Yen | H01L 21/76898 257/774 |
| 2011/0204517 A1 | 8/2011 | Gu et al. | |
| 2012/0080795 A1* | 4/2012 | Dallmann | H01L 21/76831 257/762 |
| 2012/0190188 A1 | 7/2012 | Zhao et al. | |
| 2012/0276733 A1* | 11/2012 | Saeki | H01L 21/76898 438/613 |
| 2012/0280402 A1 | 11/2012 | Pagaila et al. | |
| 2012/0280403 A1 | 11/2012 | Pagaila et al. | |
| 2013/0119547 A1* | 5/2013 | Kim | H01L 23/481 257/751 |
| 2014/0284772 A1* | 9/2014 | Ogiso | H01L 21/76898 257/621 |
| 2015/0096798 A1* | 4/2015 | Uzoh | H01L 25/00 174/267 |
| 2015/0187636 A1* | 7/2015 | Ho | H01L 24/82 257/774 |

FOREIGN PATENT DOCUMENTS

| | | |
|---|---|---|
| JP | 2003-328185 A | 11/2003 |
| JP | 2005-514767 A | 5/2005 |
| JP | 2006-32695 A | 2/2006 |
| JP | 2007-5402 | 1/2007 |
| JP | 2007-280997 | 10/2007 |
| JP | 2010-45370 A | 2/2010 |
| JP | 2011-82291 A | 4/2011 |
| JP | 2011-249844 | 12/2011 |
| JP | 2012-142414 | 7/2012 |
| JP | 2012-169669 | 9/2012 |
| JP | 2012-216722 | 11/2012 |
| JP | 2012-231096 | 11/2012 |
| JP | 2013-93499 | 5/2013 |
| TW | 200733279 A | 9/2007 |
| TW | 201044499 A1 | 12/2010 |
| TW | 201145486 A1 | 12/2011 |

OTHER PUBLICATIONS

Office Action dated Mar. 9, 2016 in Taiwanese Patent Application No. 104100082 with English translation.

* cited by examiner

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from Japanese Patent Application No. 2014-015988, filed on Jan. 30, 2014; and Japanese Patent Application No. 2014-015829, filed on Jan. 30, 2014, the entire contents of both of which are incorporated herein by reference.

FIELD

Embodiments described herein relate generally to a semiconductor device and semiconductor device manufacturing method.

BACKGROUND

Conventionally, there is a technique for reducing the occupancy area of a semiconductor device by laminating chips in a multi-layered state, where the chips includes semiconductor elements and/or integrated circuits formed on respective substrates. The laminated chips are electrically connected to each other by through-electrodes, each of which is formed of metal embedded in a through-hole penetrating a substrate.

In general, embedding of metal in a through-hole is performed by means of electrolytic plating. As electrolytic plating of this kind, for example, there is bottom-up plating that gradually deposits the metal from the closed bottom of the through-hole to the opening, and there is conformal plating that deposits the metal from the entire inner peripheral surface of the through-hole.

The conformal plating is more advantageous in that it can complete embedding of the metal in the through-hole in a shorter time, as compared with the bottom-up plating. According to such conformal plating, electric field concentration is caused at the opening end portion of the through-hole, and so the deposition rate of the metal is higher at the opening end portion than at the inner peripheral surface of the through-hole. Consequently, there may be a case where a void is formed inside the metal embedded in the through-hole.

DETAILED DESCRIPTION

According to an embodiment, a semiconductor device is provided. The semiconductor device comprises a through-hole, a copper layer, and a metal portion. The through-hole penetrates a semiconductor substrate between front and rear sides. The copper layer is formed inside the through-hole via an insulating film. The metal portion is made of a metal other than copper, formed closer to a hole core side of the through-hole than the copper layer is, and involves a void therein.

Exemplary embodiments of a semiconductor device and semiconductor device manufacturing method will be explained below in detail with reference to the accompanying drawings. The present invention is not limited to the following embodiments.

First Embodiment

Figure 1:
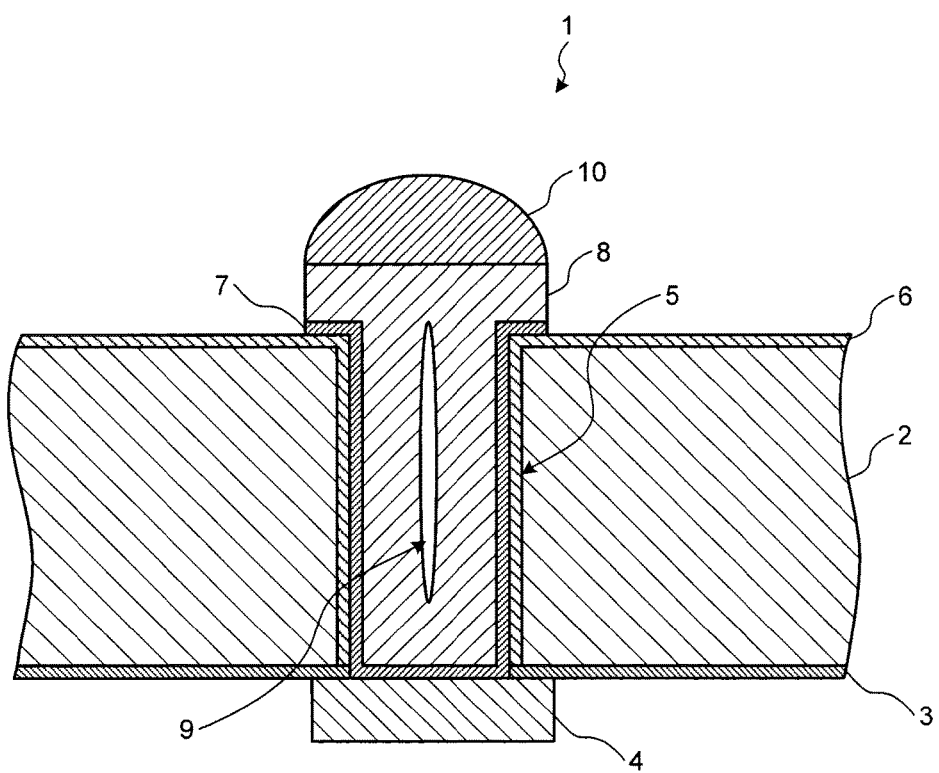
FIG. 1 is a sectional view schematically showing a configuration of a semiconductor device according to a first embodiment.

FIG. 1 is a sectional view schematically showing a configuration of a semiconductor device 1 according to a first embodiment. Hereinafter in this embodiment, for the sake of convenience, there may be a case where the upper surface of a substrate 2 shown in the drawings is referred to as a front surface and the lower surface thereof is referred to as a rear surface. As shown in FIG. 1, the semiconductor device 1 includes a through-electrode that penetrates the substrate 2 made of a semiconductor, such as Si (silicon), between its front and rear sides. The front surface of the substrate 2 is covered with an insulating film 6, and the rear surface of the substrate 2 is covered with an insulating film 3.

The through-electrode includes a bump 10, an electrode pad 4, a seed film 7, and a metal portion 8. The bump 10 is made of, for example, a solder, and is provided on the front surface side of the substrate 2. The electrode pad 4 is including, for example, a silicide, and is provided at a position opposite to the bump 10 with the substrate 2 interposed therebetween.

The seed film 7 is including, for example, Cu (copper). This seed film 7 is formed on that part of the surface of an insulating film 6 which covers the inner peripheral surface of a through-hole 5 that penetrates the substrate 2 between its front and rear sides. The seed film 7 is formed also on a surface of the electrode pad 4, and on that part of the surface of the insulating film 6 which covers the opening rim of the through-hole 5 at the front surface of the substrate 2.

The metal portion 8 is formed by depositing a metal on the surface of the seed film 7 by conformal plating. In this case, the metal portion 8 is formed closer to the hole core side of the through-hole 5 than the seed film 7 is. During the conformal plating, the metal is gradually deposited from the entire surface of the seed film 7.

In light of this, according to the semiconductor device 1, the through-hole 5 is formed such that the dimension in the depth direction is larger than the dimensions in the directions orthogonal to the depth direction, as shown in FIG. 1. This arrangement of the semiconductor device 1 makes it possible to reliably close the opening of the through-hole 5 on the front surface side of the substrate 2 by the metal portion 8, when the metal portion 8 is formed by conformal plating.

The metal portion 8 involves a void 9 therein on the hole core side of the through-hole 5. Since the semiconductor device 1 has the void 9 contained inside the metal portion 8, the substrate 2 can be prevented from being damaged when, for example, a heating process is performed to reform the bump 10 into a hemispherical shape.

More specifically, in the step of performing the heating process, the metal portion 8 may cause thermal expansion. At this time, the void 9 inside the metal portion 8 absorbs a thermal expansion force directed outward from the metal portion 8, and thereby reduces the force to be applied from the metal portion 8 to the substrate 2. Consequently, the substrate 2 can be prevented from being damaged.

The metal portion 8 is made of a material containing at least one kind of metal other than Cu, such as Ni (nickel), Au (gold), Ag (silver), Co (cobalt), Pd (palladium), W (tungsten), Ta (tantalum), platinum (Pt), rhodium (Rh), iridium (Ir), ruthenium (Ru), osmium (Os), rhenium (Re), molybdenum (Mo), niobium (Nb), boron (B), and hafnium (Hf). Thus, according to the semiconductor device 1, the metal portion 8 can be prevented from generating a shape defect therein in the step of performing conformal plating.

More specifically, in the step of performing conformal plating, a relatively high voltage may be applied to the metal portion 8. In this case, if the metal portion 8 is formed by use of Cu, which is a general material for through-electrodes, the metal portion 8 may generate a shape defect therein because Cu is a metal with relatively low resistance to electromigration.

In light of this, the metal portion 8 of the semiconductor device 1 is made of a material containing at least one kind of metal selected from Ni, Au, Ag, Co, Pd, W, Ta, Pt, Rh, Ir, Ru, Os, Re, Mo, Nb, B, and Hf, which have higher resistance to electromigration as compared with Cu.

Thus, according to the semiconductor device 1, the metal portion 8 can be prevented from generating a shape defect therein in the step of performing conformal plating. Consequently, the semiconductor device 1 can improve the conduction characteristic of the through-electrode.

Next, an explanation will be given of a manufacturing method of the semiconductor device 1 according to the first embodiment, with reference to FIGS. 2A to 4C. FIGS. 2A to 4C are sectional views showing manufacturing steps of the semiconductor device 1 according to the first embodiment. The manufacturing steps explained here are steps for forming a through-electrode portion that penetrates the substrate 2 of the semiconductor device 1 between the front and rear sides.

Figure 2A:
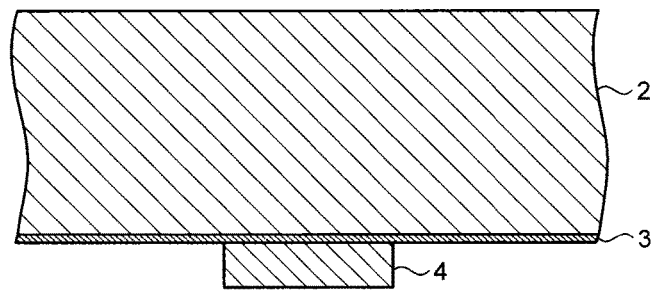
FIGS. 2A to 2C, 3A to 3C, and 4A to 4C are sectional views showing manufacturing steps of the semiconductor device according to the first embodiment.

When the through-electrode portion of the semiconductor device 1 is formed, the insulating film 3, such as an Si oxide film, is first formed, as shown in FIG. 2A, by, e.g., CVD (Chemical Vapor Deposition) on the rear surface of the substrate 2. Then, the electrode pad 4 is formed on the rear surface side of the substrate 2 by, e.g., patterning a silicide, at a predetermined position of the insulating film 3 on the rear surface side.

Figure 2B:
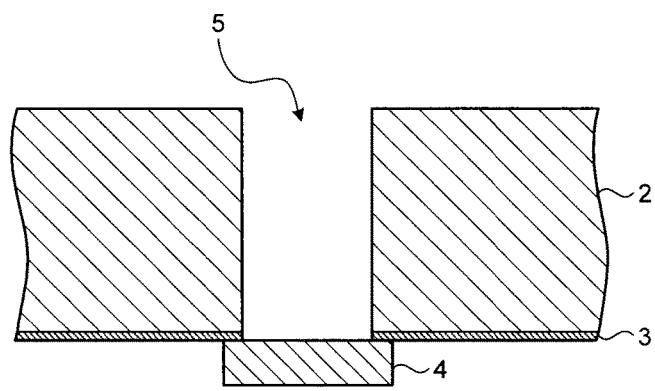

Subsequently, as shown in FIG. 2B, the through-hole 5 is formed to penetrate the substrate 2 between the front and rear sides and to expose a surface of the electrode pad 4, by performing RIE (Reactive Ion Etching) at a position of the front surface of the substrate 2 opposite to the electrode pad 4.

At this time, the through-hole is formed such that the dimension in the depth direction is larger than the dimensions in the directions orthogonal to the depth direction. Consequently, when the metal portion 8 is formed by conformal plating thereafter, the opening of the through-hole 5 on the front surface side of the substrate 2 can be reliably closed by the metal portion 8.

Figure 2C:
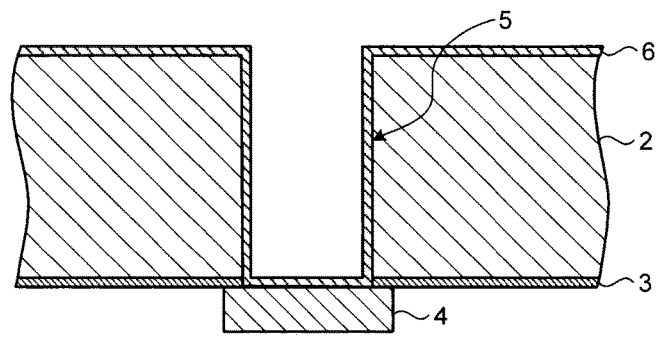
Figure 3A:
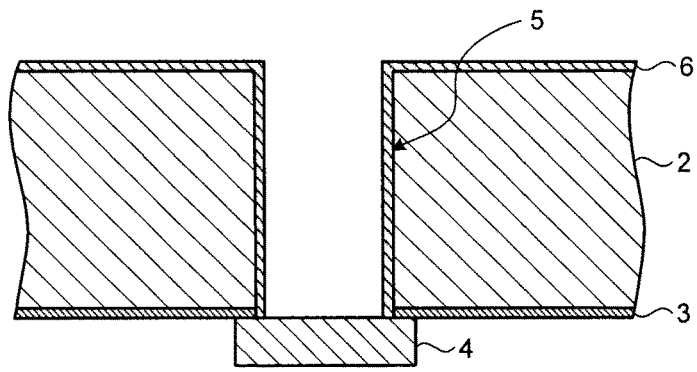

Subsequently, as shown in FIG. 2C, the insulating film 6, such as an Si oxide film, is formed by, e.g., CVD on the exposed surface of the electrode pad 4, the inner peripheral surface of the through-hole 5, and the front surface of the substrate 2. Then, as shown in FIG. 3A, the insulating film 6 formed on the surface of the electrode pad 4 is selectively removed by etching, so that the surface of the electrode pad 4 is exposed again.

Figure 3B:
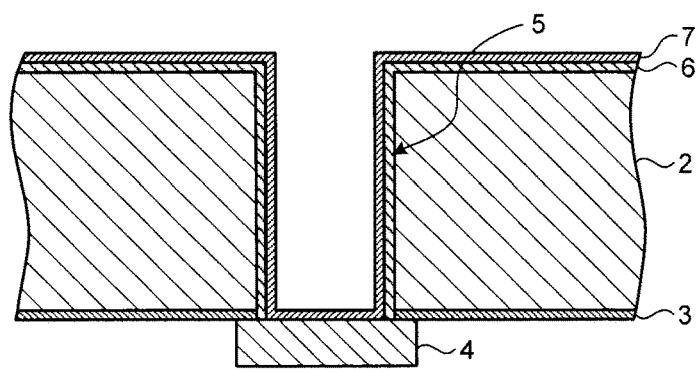

Subsequently, as shown in FIG. 3B, the seed film 7 for plating to be performed next is formed by, e.g., forming a Cu film on the exposed surface of the electrode pad 4, the surface of the insulating film 6 covering the inner peripheral surface of the through-hole 5, and the surface of the insulating film 6 covering the front surface of the substrate 2. For example, this seed film 7 is formed by vacuum evaporation or sputtering.

Figure 3C:
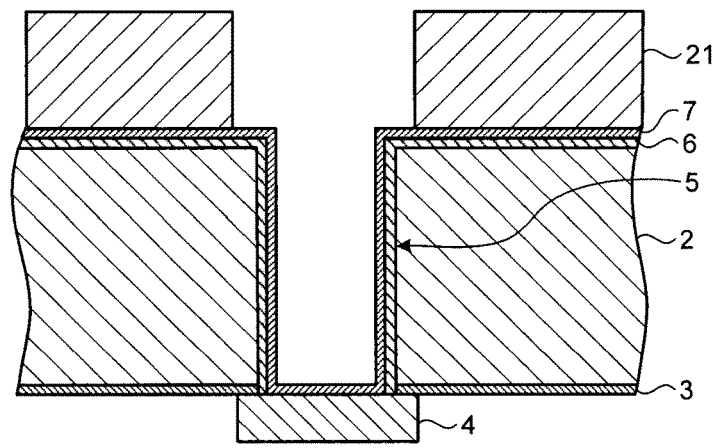

Thereafter, as shown in FIG. 3C, a resist layer 21 made of, e.g., a resin, is formed on the surface of the seed film 7 covering the front surface side of the substrate 2. Then, an opening is formed in the resist layer 21 at a position opposite to the electrode pad 4, by patterning the resist layer 21. At this time, the opening is formed such that the dimension of its cross section orthogonal to the thickness direction of the substrate 2 is almost equal to the dimension of the corresponding cross section of the electrode pad 4.

Figure 4A:
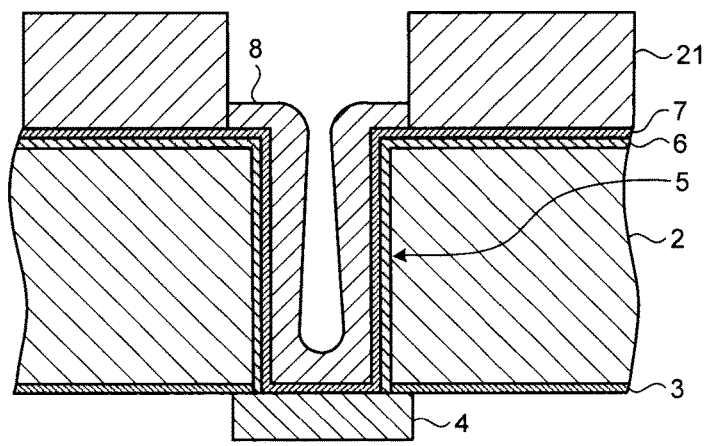

Subsequently, as shown in FIG. 4A, for example, conformal plating of Ni is performed to that part of the surface of the seed film 7 which is not covered with the resist layer 21. Consequently, formation of the metal portion 8 is started by the conformal plating inside the through-hole 5 in which the other opening on the rear surface side of the substrate 2 is closed by the seed film 7.

In this embodiment, the metal portion 8 is formed by performing conformal plating of Ni to the surface of the seed film 7. However, the material of the metal portion 8 is not limited to Ni, but may be another metal having higher resistance to electromigration as compared with Cu.

For example, the material of the metal portion 8 may be any one kind of metal selected from Au, Ag, Co, Pd, W, Ta, Pt, Rh, Ir, Ru, Os, Re, Mo, Nb, B, and Hf, or may be an alloy containing at least one kind of metal selected from Ni, Au, Ag, Co, Pd, W, Ta, Pt, Rh, Ir, Ru, Os, Re, Mo, Nb, B, and Hf.

Figure 4B:
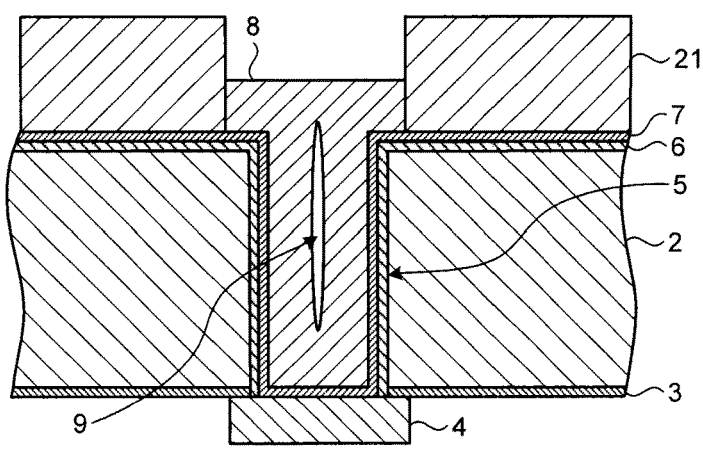

In the initial phase of formation of the metal portion 8, the inside of the through-hole 5 covered with the metal portion 8 is in a state opened at the front surface of the substrate 2. If this opening on the front surface side of the substrate 2 is not closed, it may cause damage of the semiconductor device 1 during a heating process subsequently performed. Accordingly, the conformal plating of Ni is continued thereafter, so that the opening of the through-hole 5 on the front surface side of the substrate 2 is closed by the metal portion 8, as shown in FIG. 4B. Consequently, the void 9 is formed at the center of the metal portion 8.

Figure 4C:
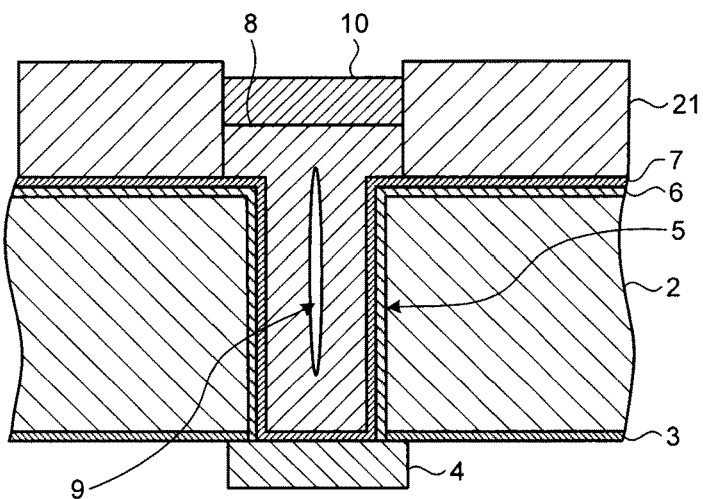

Thereafter, as shown in FIG. 4C, the bump 10 is formed on the surface of the metal portion 8 surrounded by the resist layer 21, by, e.g., laminating a solder layer. At the end, the resist layer 21 is removed along with the part of the seed film 7 directly below the resist layer 21, and then the bump 10 is reformed into a hemispherical shape by performing a heating process, so that the semiconductor device 1 shown in FIG. 1 is completed.

As described above, the semiconductor device 1 according to the first embodiment includes the through-hole 5 that penetrate the substrate 2 between the front and rear sides, and the metal portion 8 that is formed inside the through-hole 5 by conformal plating and involves the void 9 therein.

In this semiconductor device 1, when a heating process is performed in the manufacturing steps, the thermal expansion force of the metal portion 8 is alleviated by the void 9 involved in the metal portion 8, and so the substrate 2 can be prevented from being damaged due to the thermal expansion force of the metal portion 8.

Further, the metal portion 8 of the semiconductor device 1 according to the first embodiment includes at least one kind of metal selected from Ni, Au, Ag, Co, Pd, W, Ta, Pt, Rh, Ir, Ru, Os, Re, Mo, Nb, B, and Hf. These Ni, Au, Ag, Co, Pd, W, Ta, Pt, Rh, Ir, Ru, Os, Re, Mo, Nb, B, and Hf are metals having higher resistance to electromigration as compared with Cu.

Thus, according to the semiconductor device 1, when the metal portion 8 is formed by conformal plating, the metal portion 8 can be prevented from generating a shape defect therein due to electromigration caused by a voltage applied to the metal portion 8. Consequently, the semiconductor device 1 can improve the conduction characteristic of the through-electrode.

Figure 5:
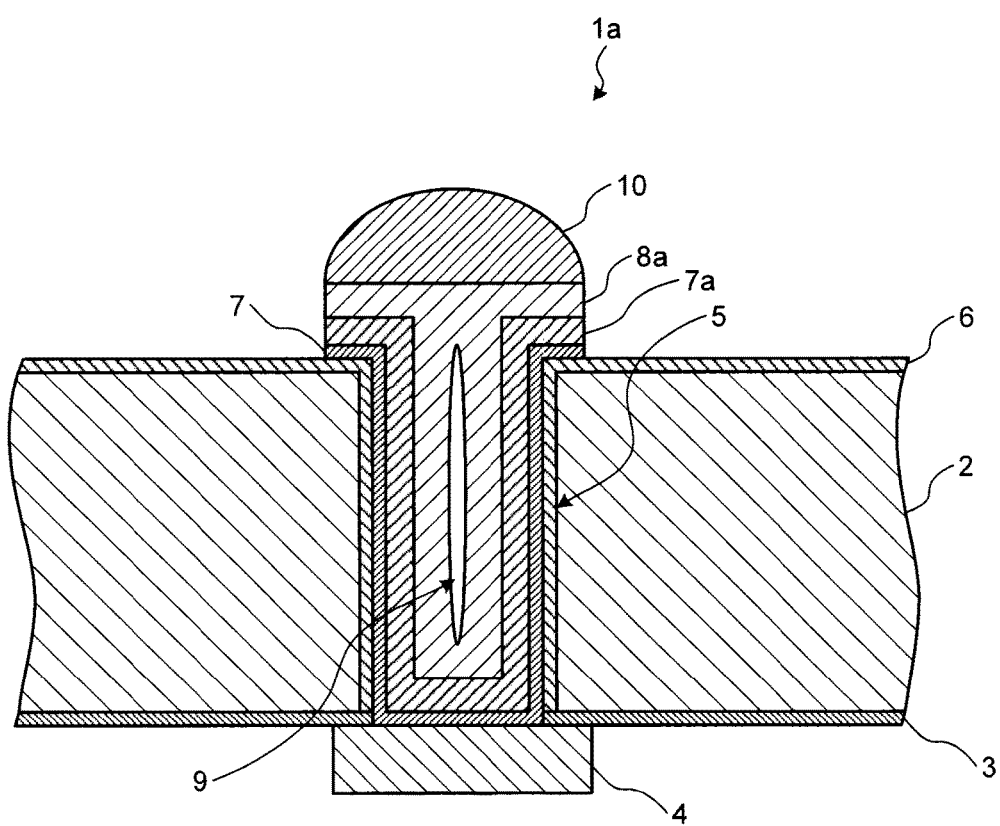
FIG. 5 is a sectional view schematically showing a configuration of a semiconductor device according to a modification of the first embodiment.

The first embodiment described above is a mere example, and can be modified in various ways. FIG. 5 is a sectional view schematically showing a configuration of a semiconductor device 1a according to a modification of the first embodiment. Hereinafter in this modification, structural elements the same as those shown in FIG. 1 are denoted by the same reference symbols as those shown in FIG. 1, and their descriptions are partly omitted.

As shown in FIG. 5, the semiconductor device 1a has the same configuration as the semiconductor device 1 except that it includes a Cu layer 7a covering the outer peripheral surface of a metal portion 8a on the through-hole 5 side. The Cu layer 7a is formed by performing conformal plating of Cu to the surface of the seed film 7 shown in FIG. 3C.

The metal portion 8a is formed on the surface of the Cu layer 7a by performing conformal plating of a material containing at least one kind of metal selected from Ni, Au, Ag, Co, Pd, W, Ta, Pt, Rh, Ir, Ru, Os, Re, Mo, Nb, B, and Hf. Consequently, the metal portion 8a is formed closer to the hole core side of the through-hole 5 than the Cu layer 7a is. This metal portion 8a also involves a void 9 therein, as in the metal layer 8 shown in FIG. 1.

Thus, according to the semiconductor device 1a, when a heating process is performed in the manufacturing steps, the thermal expansion force of the metal portion 8a is alleviated by the void 9 involved in the metal portion 8a, and so the substrate 2 can be prevented from being damaged due to the thermal expansion force of the metal portion 8a.

Further, the void 9 of the semiconductor device 1a is involved in a metal having higher resistance to electromigration as compared with Cu. Thus, according to the semiconductor device 1a, when the metal portion 8a is formed by conformal plating, the metal portion 8a can be prevented from generating a shape defect therein due to electromigration. Consequently, the semiconductor device 1a can improve the conduction characteristic of the through-electrode.

Further, according to the semiconductor device 1a, the amount of metal used for forming the metal portion 8a, such as Ni, Au, Ag, Co, Pd, W, Ta, Pt, Rh, Ir, Ru, Os, Re, Mo, Nb, B, and Hf, which are more expensive than Cu, is reduced. Thus, the semiconductor device 1a can lower the manufacturing cost.

Second Embodiment

Figure 6:
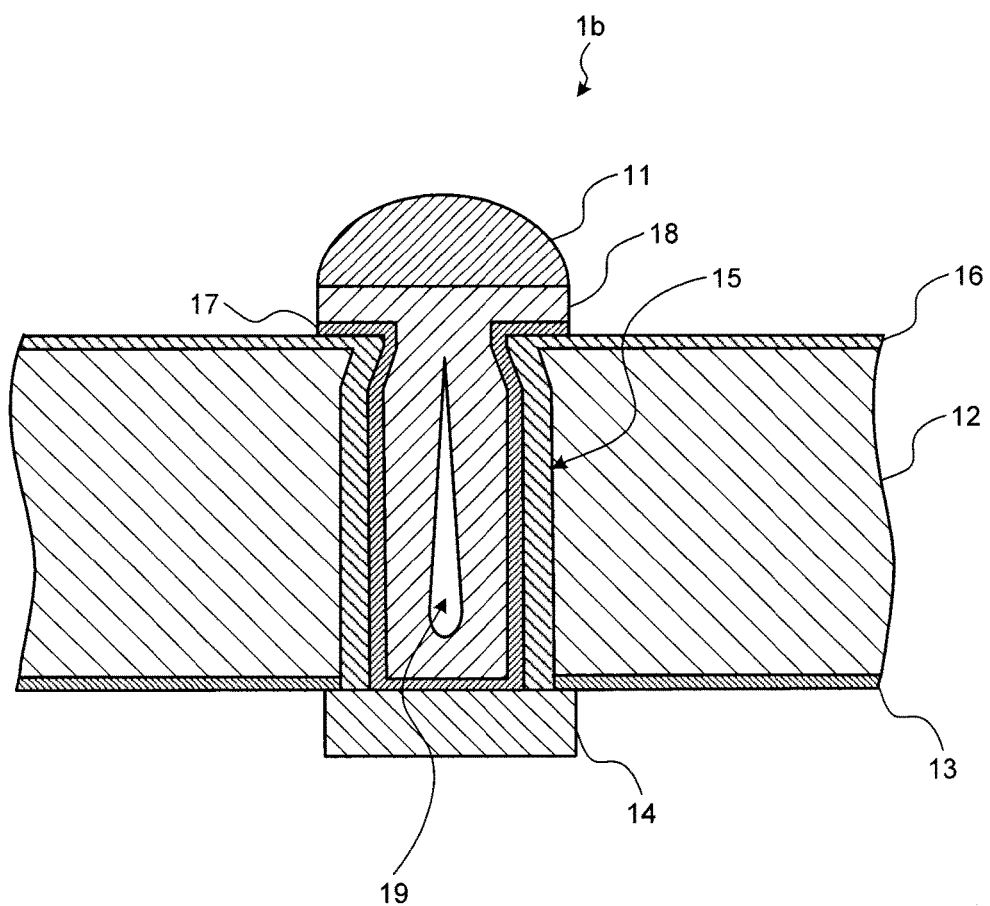
FIG. 6 is a sectional view schematically showing a configuration of a semiconductor device according to a second embodiment.

FIG. 6 is a sectional view schematically showing a configuration of a semiconductor device 1b according to a second embodiment. Hereinafter in this embodiment, for the sake of convenience, there may be a case where the upper surface of a substrate 12 shown in the drawings is referred to as a front surface and the lower surface thereof is referred to as a rear surface. As shown in FIG. 6, the semiconductor device 1b includes a through-electrode that penetrates the substrate 12 made of a semiconductor, such as Si (silicon), between its front and rear sides. The front surface of the substrate 12 is covered with an insulating film 16, and the rear surface of the substrate 12 is covered with an insulating film 13.

The through-electrode includes a bump 11, an electrode pad 14, a seed film 17, and a metal portion 18. The bump 11 is made of, for example, a solder, and is provided on the front surface side of the substrate 12. The electrode pad 14 is made of, for example, a silicide, and is provided at a position opposite to the bump 11 with the substrate 12 interposed therebetween.

The seed film 17 is made of, for example, Cu (copper). This seed film 17 is formed on that part of the surface of an insulating film 16 which covers the inner peripheral surface of a through-hole 15 that penetrates the substrate 12 between its front and rear sides. The seed film 17 is formed also on a surface of the electrode pad 14, and on that part of the surface of the insulating film 16 which covers the opening rim of the through-hole 15 at the front surface of the substrate 12.

The metal portion 18 is made of, for example, Ni (nickel). This metal portion 18 is formed on the surface of the seed film 17 by, e.g., performing conformal plating of Ni (nickel).

As shown in FIG. 6, the through-hole 15 that penetrates the substrate 12 between the front and rear sides is formed such that the dimension of its one opening on the front surface side of the substrate 12 is smaller than the dimension of its other opening, which is closed by the electrode pad 14, on the rear surface side of the substrate 12. In this case, each of the insulating film 16 that covers the inner peripheral surface of the through-hole 15 and the seed film 17 that covers the insulating film 16 partly has a shape formed by copying the shape of the through-hole 15.

Specifically, at the time when the seed film 17 is formed, a hole covered with the seed film 17 is present inside the substrate 12 such that the dimension of its opening on the front surface side of the substrate 12 is smaller than the dimension of its bottom on the rear surface side of the substrate 12.

Accordingly, when the metal portion 18 is formed on the inner peripheral surface of the hole having this shape by depositing Ni by conformal plating, the opening of the hole can be closed in a shorter time, as compared with, for example, a case where the hole has a cylindrical shape extending in a direction parallel with the thickness direction of the substrate 12.

Thus, according to the semiconductor device 1b, that part of the metal portion 18 which is formed above the front surface of the substrate 12 becomes thinner, and so the entire thickness of the semiconductor device 1b can be reduced, as compared with, for example, a case where the through-hole 15 formed in the substrate in advance for formation of the through-electrode is a cylindrical through-hole penetrating the substrate 12 in the thickness direction.

In addition, the through-hole 15 is formed such that the dimension of its cross section orthogonal to the thickness direction of the substrate 12 is constant from the other opening on the rear surface side of the substrate 12 to an intermediate portion in a direction toward the one opening on the front surface side and then the dimension of the cross section becomes gradually smaller from the intermediate portion toward the one opening on the front surface side of the substrate 12. In other words, the through-hole 15 becomes narrower in a tapered shape toward the front surface side of the substrate 12, and the cross section of the corner of the one opening on the front surface side of the substrate 12 is in a sharpened state with an acute angle smaller than 90°.

In the case of conformal plating, electric field concentration is caused more at a sharpened portion than at a flat portion, and so the metal deposition rate by the plating is higher at the sharpened portion. Thus, according to the manufacturing steps of the semiconductor device 1b, the one opening on the front surface side of the substrate 12 is closed by the metal portion 18 in a shorter time by conformal plating.

Further, the semiconductor device 1b includes a closed void 19 at the center of the metal portion 18. Thus, according to the semiconductor device 1b, the substrate 12 can be prevented from being damaged when, for example, a heating process is performed to reform the bump 11 into a hemispherical shape.

More specifically, in the step of performing the heating process, the metal portion 18 may cause thermal expansion. At this time, the void 19 inside the metal portion 18 absorbs a thermal expansion force directed outward from the metal portion 18, and thereby reduces the force to be applied from the metal portion 18 to the substrate 12. Consequently, the substrate 2 can be prevented from being damaged.

Further, according to the manufacturing steps of the semiconductor device 1b, since the opening of the through-hole 15 on the front surface side of the substrate 12 is closed by the metal portion 18 in a relatively short time, the void 19 inside the metal portion 18 is formed at a deep position inside the substrate 12 distant from the front surface of the substrate 12. Thus, the upper end of the void 19 is positioned below the front surface of the substrate 12.

Thus, according to the semiconductor device 1b, that part of the metal portion 18 which projects upward from the front surface of the substrate 12 can be made smaller in thickness, and so control and management for the thickness of this portion can be more easily performed, as compared with a case where the upper end of the void 19 is positioned above the front surface of the substrate 12.

Further, the void 19 of the semiconductor device 1b is formed inside the metal portion 18 made of Ni having higher resistance to electromigration as compared with Cu. Thus, when a relatively high voltage is applied to the metal portion 18 in the step of performing conformal plating, the void 19 is prevented from displacing its position inside the metal portion 18, and so the metal portion 18 and the substrate 12 can be prevented from being damaged due to electromigration.

Next, an explanation will be given of a manufacturing method of the semiconductor device 1b according to the second embodiment, with reference to FIGS. 7A to 9C. FIGS. 7A to 9C are sectional views showing manufacturing steps of the semiconductor device 1b according to the second embodiment. The manufacturing steps explained here are steps for forming a through-electrode portion that penetrates the substrate 12 of the semiconductor device 1b between the front and rear sides.

Figure 7A:
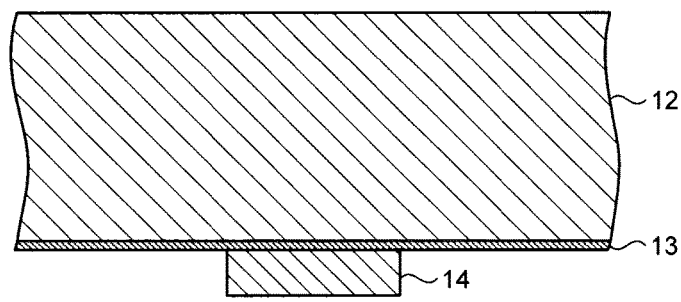
FIGS. 7A to 7C, 8A to 8C, and 9A to 9C are sectional views showing manufacturing steps of the semiconductor device according to the second embodiment.

When the through-electrode portion of the semiconductor device 1b is formed, the insulating film 13, such as an Si oxide film, is first formed, as shown in FIG. 7A, by, e.g., CVD (Chemical Vapor Deposition) on the rear surface of the substrate 12. Then, the electrode pad 14 is formed on the rear surface side of the substrate 12 by, e.g., patterning a silicide, at a predetermined position of the insulating film 13 on the rear surface side.

Figure 7B:
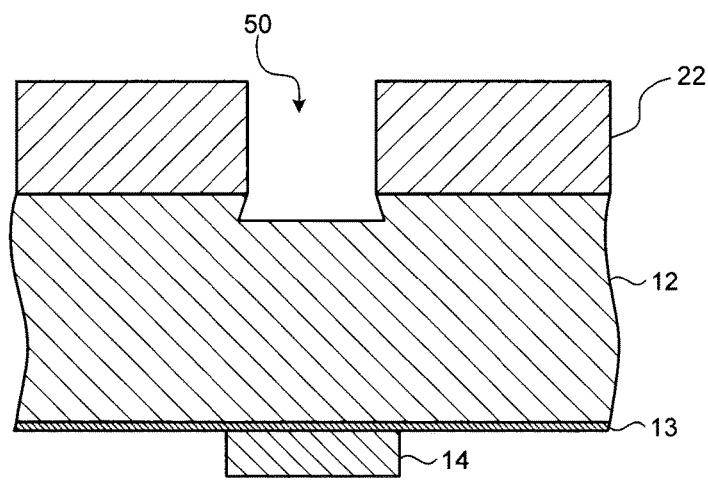

Subsequently, as shown in FIG. 7B, a resist layer 22 made of, e.g., a resin, is formed on the front surface of the substrate 12. Then, an opening 50 is formed in the resist layer 22 at a position opposite to the electrode pad 14, by patterning the resist layer 22. At this time, the opening 50 is formed such that the dimension of its cross section orthogonal to the thickness direction of the substrate 12 is smaller than the dimension of the corresponding cross section of the electrode pad 14.

Thereafter, RIE (Reactive Ion Etching) is performed to the Si substrate by use of the resist layer 22 as a mask. In this step, the RIE is performed by supplying a mixture gas of an etching gas and a protection film formation gas into an etching chamber.

For example, $CF_4$ (tetrafluoromethane), $CHF_3$ (trifluoromethane), or the like is used as the etching gas. Further, for example, $C_4F_8$ (octafluorocyclobutane) or the like is used as the protection film formation gas. It should be noted that these gases are mere examples. At this time, the content of the protection film formation gas in the mixture gas is set lower, as compared with a case where a cylindrical through-hole is formed to penetrate the substrate 12 in the thickness direction.

Consequently, as shown in FIG. 7B, erosion of the substrate 12 by the RIE makes progress not only in the thickness direction of the substrate 12 (vertical direction) but also in a direction perpendicular to the thickness direction (horizontal direction). Thus, the horizontal direction dimension of the opening 50 formed in the substrate 12 becomes gradually larger along with an increase in the depth of the opening 50, as compared with the horizontal direction dimension of the opening 50 at the front surface of the substrate 12.

Then, the content of the protection film formation gas in the mixture gas is increased. More specifically, the content of the protection film formation gas is adjusted such that erosion of the substrate 12 by the RIE makes progress in the thickness direction of the substrate 12 (vertical direction) but it does not make progress, as far as possible, in a direction perpendicular to the thickness direction (horizontal direction).

In other words, the content of the protection film formation gas is adjusted such that a cylindrical through-hole is formed to penetrate the substrate 12 in the thickness direction. The RIE is further continued under such process conditions, so that a surface of the electrode pad 14 is exposed.

Figure 7C:
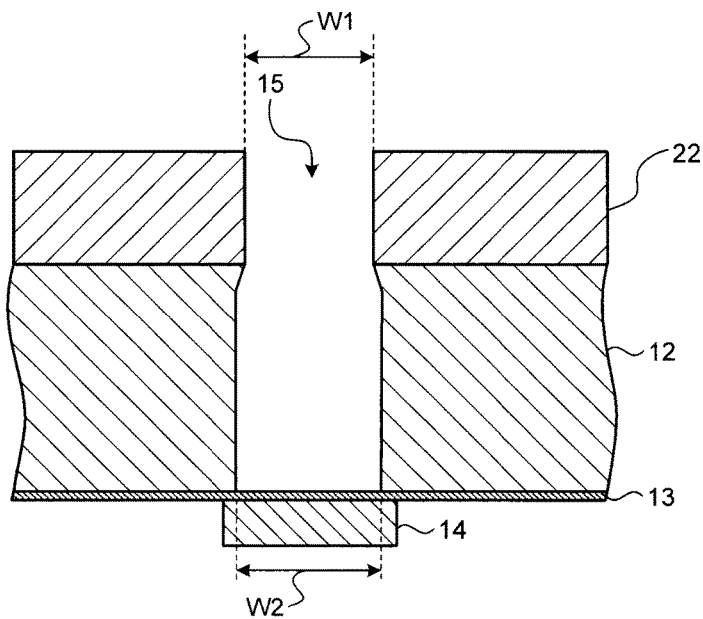

Consequently, as shown in FIG. 7C, the through-hole 15 is formed in the substrate 12 such that the dimension W1 of its one opening formed on the front surface side is small than the dimension W2 of its other opening formed on the rear surface side. More specifically, the through-hole 15 is formed such that the dimension of its cross section orthogonal to the thickness direction of the substrate 12 is almost constant from the other opening on the rear surface side of the substrate 12 to an intermediate portion in a direction toward the one opening on the front surface side and then the dimension of the cross section becomes gradually smaller from the intermediate portion toward the one opening on the front surface side of the substrate 12.

In other words, it is assumed that the dimension of the cross section orthogonal to the thickness direction of the substrate 12 has a decreasing degree along with a positional change from the other opening on the rear surface side of the substrate 12 to the intermediate portion in a direction toward the one opening on the front surface side, and that the dimension of the cross section has another decreasing degree along with a positional change from the intermediate portion toward the one opening on the front surface side of the substrate 12. Under this assumption, the through-hole 15 is formed such that said another decreasing degree of the cross section dimension is larger than the former decreasing degree of the cross section dimension.

Figure 8A:
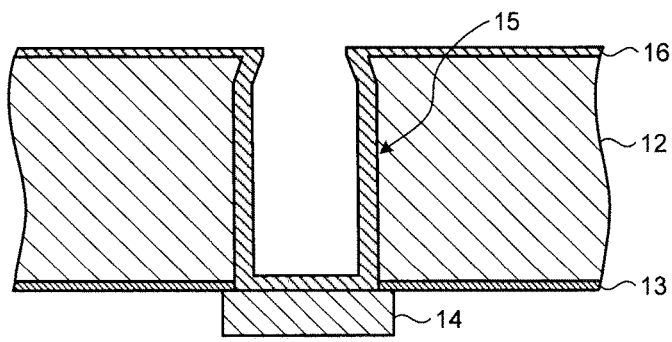
Figure 8B:
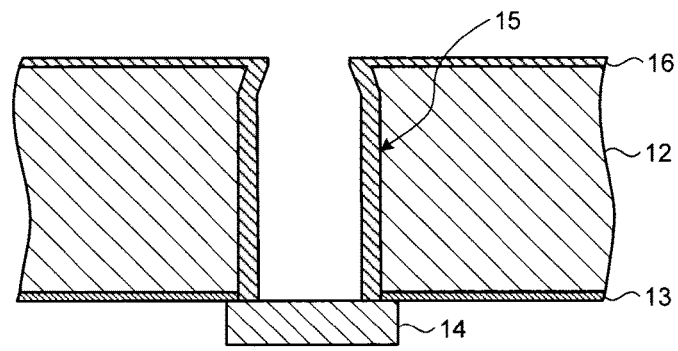

Subsequently, as shown in FIG. 8A, the insulating film 16, such as an Si oxide film, is formed by, e.g., CVD on the exposed surface of the electrode pad 14, the inner peripheral surface of the through-hole 15, and the front surface of the substrate 12. Then, as shown in FIG. 8B, the insulating film 16 formed on the surface of the electrode pad 14 is selectively removed by etching, so that the surface of the electrode pad 14 is exposed again.

Figure 8C:
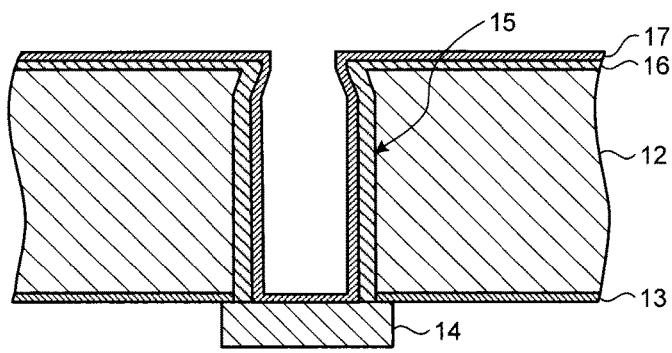

Thereafter, as shown in FIG. 8C, the seed film 17 for plating to be performed next is formed by, e.g., forming a Cu film on the exposed surface of the electrode pad 14, the surface of the insulating film 16 covering the inner peripheral surface of the through-hole 15, and the surface of the insulating film 16 covering the front surface of the substrate 12. For example, this seed film 17 is formed by vacuum evaporation or sputtering.

Figure 9A:
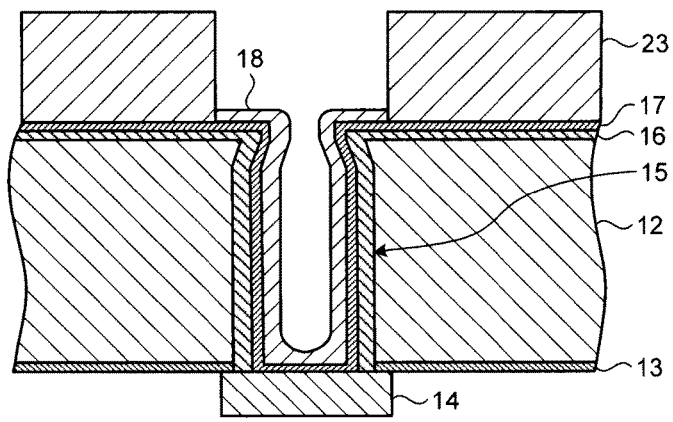

Subsequently, as shown in FIG. 9A, a resist layer 23 made of, e.g., a resin, is formed on the surface of the seed film 17 covering the front surface side of the substrate 12. Then, an opening is formed in the resist layer 23 at a position opposite to the electrode pad 14, by patterning the resist layer 23. At this time, the opening is formed such that the dimension of its cross section orthogonal to the thickness direction of the substrate 12 is almost equal to the dimension of the corresponding cross section of the electrode pad 14.

Subsequently, for example, conformal plating of Ni is performed to that part of the surface of the seed film 17 which is not covered with the resist layer 23. Consequently, formation of the metal portion 18 is started by the conformal plating inside the through-hole 15 in which the other opening on the rear surface side of the substrate 12 is closed by the seed film 17.

Figure 9B:
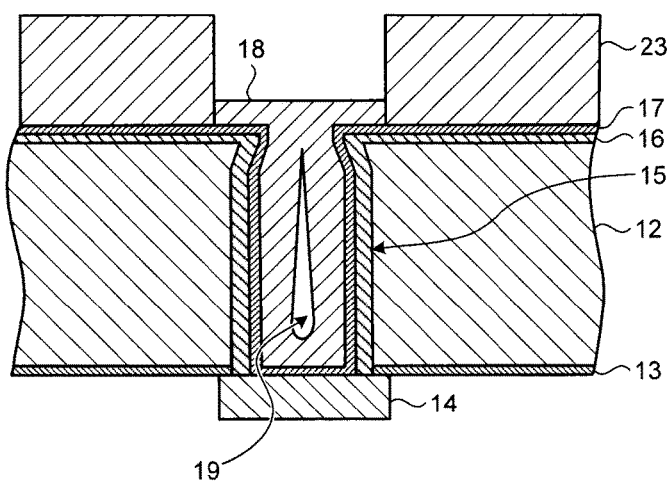

In the initial phase of formation of the metal portion 18, the inside of the through-hole 15 covered with the metal portion 18 is in a state opened at the front surface of the substrate 12. If this opening on the front surface side of the substrate 12 is not closed, it may cause damage of the semiconductor device 1b during a heating process subsequently performed. Accordingly, the conformal plating of Ni is continued thereafter, so that the opening of the through-hole 15 on the front surface side of the substrate 12 is closed by the metal portion 18, as shown in FIG. 9B. Consequently, the void 19 is formed at the center of the metal portion 18.

Figure 9C:
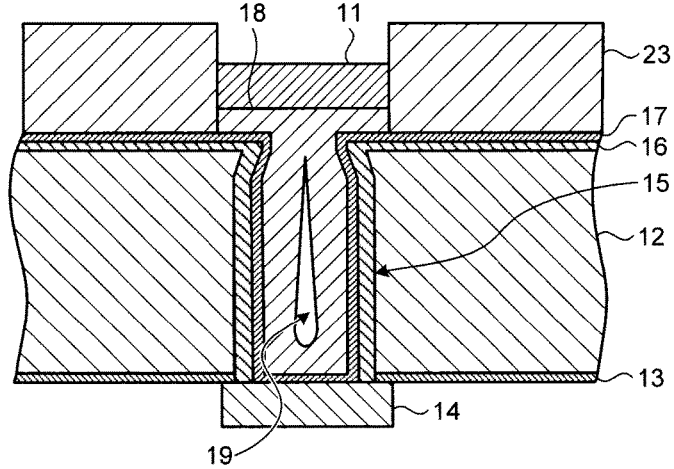

Thereafter, as shown in FIG. 9C, the bump 11 is formed on the surface of the metal portion 18 surrounded by the resist layer 23, by, e.g., laminating a solder layer. At the end, the resist layer 23 is removed along with the part of the seed film 17 directly below the resist layer 23, and then the bump 11 is reformed into a hemispherical shape by performing a heating process, so that the semiconductor device 1b shown in FIG. 6 is completed.

As described above, the semiconductor device 1b according to the second embodiment includes the through-hole 15 that penetrate the substrate 12 between the front and rear sides, in which the dimension of its one opening is smaller than the dimension of its other opening. Further, the semiconductor device 1b includes the metal portion 18 that closes the one opening of the through-hole 15, wherein the metal portion 18 is formed by conformal plating inside the through-hole 15 having its other end closed.

Thus, according to the semiconductor device 1b of the second embodiment, that part of the metal portion 18 which projects upward from the front surface of the substrate 12 can be made smaller in thickness, and so the entire thickness of the semiconductor device 1b can be reduced.

Third Embodiment

Figure 10:
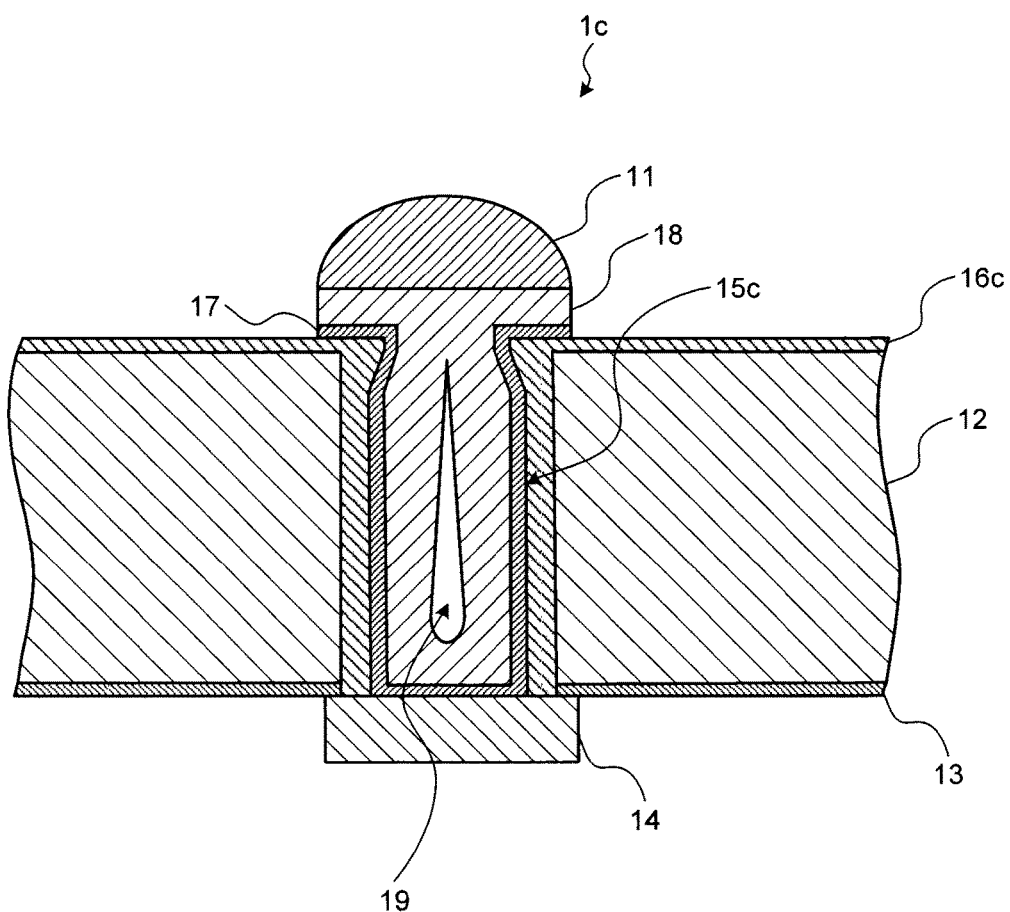
FIG. 10 is a sectional view schematically showing a configuration of a semiconductor device according to a third embodiment.

FIG. 10 is a sectional view schematically showing a configuration of a semiconductor device 1c according to a third embodiment. Hereinafter in this embodiment, structural elements the same as those shown in FIG. 6 are denoted by the same reference symbols as those shown in FIG. 6, and their descriptions are partly omitted.

As shown in FIG. 10, the semiconductor device 1c has the same configuration as the semiconductor device 1b shown in FIG. 6 except that the shape of a hole that penetrates a substrate 12 between the front and rear sides and the shape of an insulating film 16c that covers the inner peripheral surface of the hole are different from those of the semiconductor device 1b shown in FIG. 6.

More specifically, in the semiconductor device 1b shown in FIG. 6, the through-hole 15 that penetrates the substrate 12 between the front and rear sides is formed by processing the substrate 12, such that the dimension of its one opening on the front surface side of the substrate 12 is smaller than the dimension of its other opening on the rear surface side of the substrate 12.

On the other hand, in the semiconductor device 1c shown in FIG. 10, a through-hole 15c that penetrates the substrate 12 between the front and rear sides is formed by use of an insulating film 16c covering the inner peripheral surface of a cylindrical void penetrating the substrate 12 between the front and rear sides, so that the dimension of its one opening on the front surface side of the substrate 12 is smaller than the dimension of its other opening on the rear surface side of the substrate 12.

Also in the manufacturing steps for manufacturing the semiconductor device 1c, a seed film 17 has a shape formed by copying the shape of the through-hole 15c. Specifically, at the time when the seed film 17 is formed, a hole covered with the seed film 17 is present inside the substrate 12 such that the dimension of its opening on the front surface side of the substrate 12 is smaller than the dimension of its bottom on the rear surface side of the substrate 12.

Accordingly, when the metal portion 18 is formed on the inner peripheral surface of the hole having this shape by depositing Ni by conformal plating, the opening of the hole can be closed by the metal portion 18 in a shorter time, as in the second embodiment. Thus, according to the semiconductor device 1c, the entire thickness of the semiconductor device 1c can be reduced, as in the second embodiment.

Further, since the semiconductor device 1c has the same configuration as the semiconductor device 1b shown in FIG. 6 except for the shape of the hole that penetrates the substrate 12 between the front and rear sides and the shape of the insulating film 16c that covers the inner peripheral surface of the hole, the semiconductor device 1c can provides the other effects provided by the second embodiment, in the same way.

Next, an explanation will be given of a manufacturing method of the semiconductor device 1c according to the third embodiment, with reference to FIGS. 11A to 13B. FIGS. 11A to 13B are sectional views showing manufacturing steps of the semiconductor device 1c according to the third embodiment. The manufacturing steps explained here are steps for forming a through-electrode portion that penetrates the substrate 12 of the semiconductor device 1c between the front and rear sides.

Figure 11A:
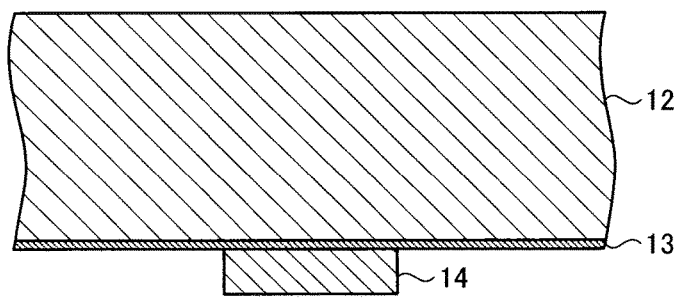
FIGS. 11A to 11C, 12A to 12C, and 13A to 13B are sectional views showing manufacturing steps of the semiconductor device according to the third embodiment.

When the through-electrode portion of the semiconductor device 1c is formed, an insulating film 13, such as an Si oxide film, is first formed, as shown in FIG. 11A, by, e.g., CVD on the rear surface of the substrate 12. Then, an electrode pad 14 is formed on the rear surface side of the substrate 12 by, e.g., patterning a silicide, at a predetermined position of the insulating film 13 on the rear surface side.

Figure 11B:
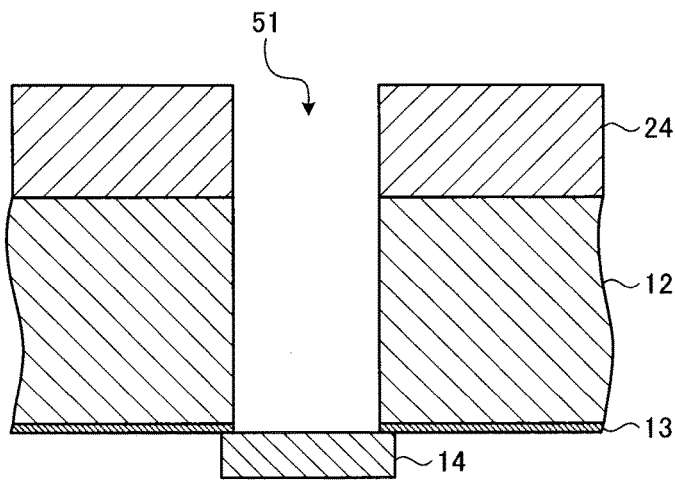

Subsequently, as shown in FIG. 11B, a resist layer 24 made of, e.g., a resin, is formed on the front surface of the substrate 12. Then, an opening is formed in the resist layer 24 at a position opposite to the electrode pad 14, by patterning the resist layer 24.

Thereafter, RIE (Reactive Ion Etching) is performed to the Si substrate by use of the resist layer 24 as a mask. In this step, the RIE is performed by supplying a mixture gas of an etching gas and a protection film formation gas into an etching chamber.

For example, $CF_4$ (tetrafluoromethane), $CHF_3$ (trifluoromethane), or the like is used as the etching gas. Further, for example, $C_4F_8$ (octafluorocyclobutane) or the like is used as the protection film formation gas. It should be noted that these gases are mere examples.

At this time, the content of the protection film formation gas is adjusted such that erosion of the substrate 12 by the RIE makes progress in the thickness direction of the substrate 12 (vertical direction) but it does not make progress, as far as possible, in a direction perpendicular to the thickness direction (horizontal direction). Consequently, a cylindrical void 51 is formed such that it penetrates the substrate 12 in the thickness direction. Then, the RIE is further continued, so that a surface of the electrode pad 14 is exposed.

Figure 11C:
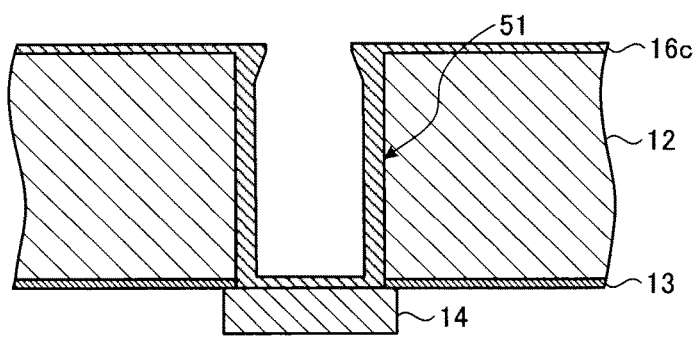

Subsequently, the resist layer 24 is removed, and then, as shown in FIG. 11C, the insulating film 16c, such as an Si oxide film, is formed by, e.g., CVD on the exposed surface of the electrode pad 14, the inner peripheral surface of the cylindrical void 51 formed in the substrate 12, and the front surface of the substrate 12.

At this time, the film formation conditions for the insulating film 16c are adjusted such that the film thickness of that part of the insulating film 16c which covers the corner of the cylindrical void 51 that is to be an opening end portion on the front surface side of the substrate 12 is larger than the film thickness of that part of the insulating film 16c which covers the inner peripheral surface of the cylindrical void 51.

Figure 12A:
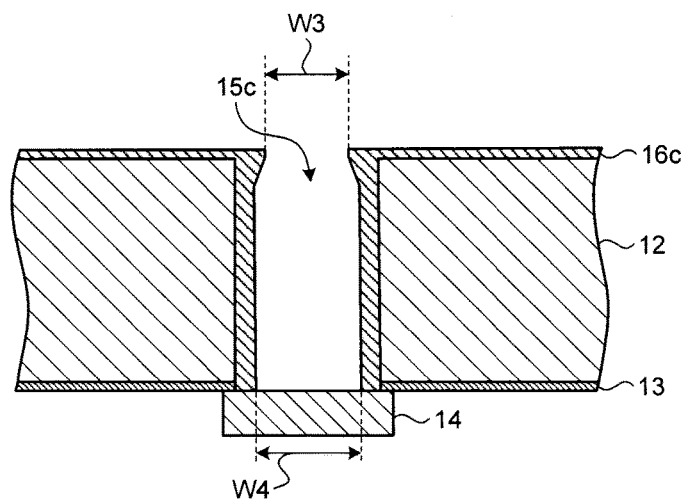

Thereafter, as shown in FIG. 12A, the insulating film 16c formed on the surface of the electrode pad 14 is selectively removed by etching, so that the surface of the electrode pad 14 is exposed again. Consequently, the through-hole 15c is shaped by use of the insulating film 16c such that the dimension W3 of its one opening on the front surface side of the substrate 12 is small than the dimension W4 of its other opening on the rear surface side of the substrate 12.

Figure 12B:
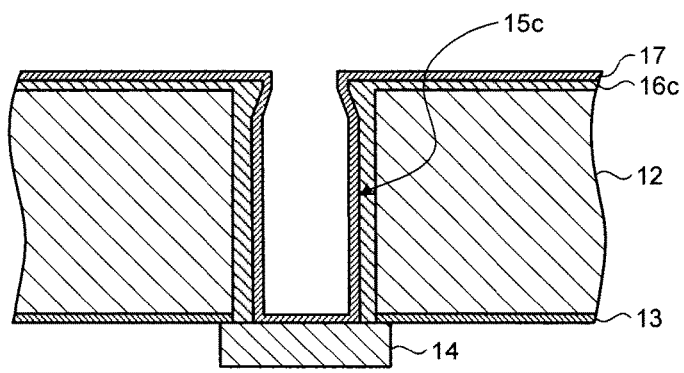
Figure 12C:
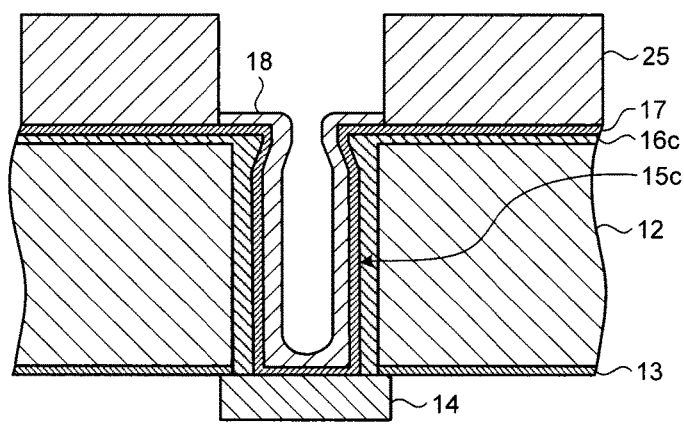

Subsequently, as shown in FIG. 12B, the seed film 17 for plating to be performed next is formed by, e.g., forming a Cu film on the exposed surface of the electrode pad 14, the surface of the insulating film 16c covering the inner peripheral surface of the through-hole 15c, and the surface of the insulating film 16c covering the front surface of the substrate 12. For example, this seed film 17 is formed by vacuum evaporation or sputtering.

Subsequently, as shown in FIG. 12A, a resist layer 25 made of, e.g., a resin, is formed on the surface of the seed film 17 covering the front surface side of the substrate 12. Then, an opening is formed in the resist layer 25 at a position opposite to the electrode pad 14, by patterning the resist layer 25. At this time, the opening is formed such that the dimension of its cross section orthogonal to the thickness direction of the substrate 12 is almost equal to the dimension of the corresponding cross section of the electrode pad 14.

Subsequently, for example, conformal plating of Ni is performed to that part of the surface of the seed film 17 which is not covered with the resist layer 25. Consequently, formation of the metal portion 18 is started by the conformal plating inside the through-hole 15c in which the other opening on the rear surface side of the substrate 12 is closed by the seed film 17.

Figure 13A:
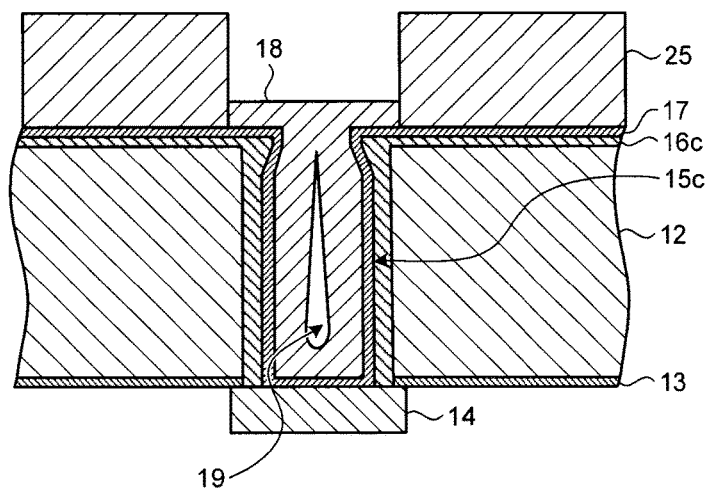

Then, the conformal plating of Ni is continued, so that the opening of the through-hole 15c on the front surface side of the substrate 12 is closed by the metal portion 18, as shown in FIG. 13A. Consequently, a void 19 is formed at the center of the metal portion 18.

Figure 13B:
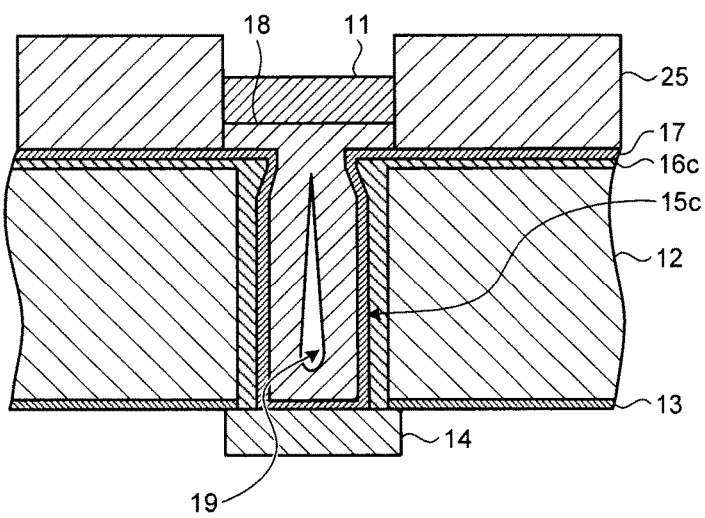

Thereafter, as shown in FIG. 13B, a bump 11 is formed on the surface of the metal portion 18 surrounded by the resist layer 25, by, e.g., laminating a solder layer. At the end, the resist layer 25 is removed along with the part of the seed film 17 directly below the resist layer 25, and then the bump 11 is reformed into a hemispherical shape by performing a heating process, so that the semiconductor device 1c shown in FIG. 10 is completed.

As described above, according to the third embodiment, the through-hole 15c that penetrates the substrate 12 between the front and rear sides is shaped by use of the insulating film 16c covering the inner peripheral surface of a cylindrical void penetrating the substrate 12 between the front and rear sides, so that the dimension of its one opening on the front surface side of the substrate 12 is smaller than the dimension of its other opening on the rear surface side of the substrate 12.

Thus, according to the semiconductor device 1c of the third embodiment, that part of the metal portion 18 which projects upward from the front surface of the substrate 12 can be made smaller in thickness, and so the entire thickness of the semiconductor device 1c can be reduced. It should be noted that the metal portion 18 is described as being made of Ni in the second embodiment and the third embodiment, but the material of the metal portion 18 is not limited to Ni.

For example, the metal portion 18 may be made of another metal selected from Au (gold), Ag (silver), Co (cobalt), Pd (palladium), W (tungsten), Ta (tantalum), platinum (Pt), rhodium (Rh), iridium (Ir), ruthenium (Ru), osmium (Os), rhenium (Re), molybdenum (Mo), niobium (Nb), boron (B), and hafnium (Hf), which have higher resistance to electromigration as compared with Cu. Further, the metal portion 18 may be made of an alloy containing some of these metals.

Further, the metal portion 18 may be made of Cu in a case where the voltage used for conformal plating is relatively low. When Cu is used as the material of the metal portion 18, for example, the metal portion 18 can be formed at a lower cost, as compared with use of Au, Ag, Co, Pd, W, Ta, Pt, Rh, Ir, Ru, Os, Re, Mo, Nb, B, Hf or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:
   forming a through-hole surrounded by an insulating film at least at a first surface of a semiconductor substrate, wherein the through-hole penetrates a semiconductor substrate between the first surface and a second surface of the semiconductor substrate and is made such that a dimension of one opening of the through-hole is smaller than a dimension of the other opening of the through-hole, the second surface being opposite to the first surface, the one opening of the through-hole being formed on the first surface; and
   forming a metal portion by conformal plating inside the through-hole having the other opening closed, the metal portion involving therein a void that is closed at the one opening of the through-hole, the through-hole being made such that a dimension of a cross section orthogonal to a thickness direction of the substrate becomes gradually larger from the one opening toward an intermediate portion of the through-hole in a direction toward the other opening and is kept constant from the intermediate portion to at least another intermediate portion in a direction toward the other opening.

2. The semiconductor device manufacturing method according to claim 1, wherein the forming the through-hole comprises
   forming a cylindrical void that penetrates the substrate between the first surface and the second surface,
   covering an inner peripheral surface of the cylindrical void with the insulating film, and
   processing the insulating film to make the through-hole such that the dimension of the one opening is smaller than the dimension of the other opening.

3. The semiconductor device manufacturing method according to claim 1, further comprising forming a first pad on the second surface of the substrate, the first pad being connected to the metal portion.

4. The semiconductor device manufacturing method according to claim 1, further comprising forming a first pad on the second surface of the substrate before forming the through-hole, the first pad being connected to the metal portion.

5. The semiconductor device manufacturing method according to claim 1, further comprising forming a seed film inside the through-hole,
   wherein the metal portion is formed on the seed film.

6. The semiconductor device manufacturing method according to claim 5, further comprising forming a first pad on the second surface of the substrate, the first pad being connected to the metal portion.

7. The semiconductor device manufacturing method according to claim 5, wherein the seed film is formed on the first pad.

8. The semiconductor device manufacturing method according to claim 1, further comprising a bump that is formed on the metal portion.

9. The semiconductor device manufacturing method according to claim 8, wherein the bump is formed on the first surface.

10. A semiconductor device manufacturing method comprising:
    forming a through-hole surrounded by an insulating film at least at a first surface of a semiconductor substrate, wherein the through-hole penetrates a semiconductor substrate between the first surface and a second surface of the semiconductor substrate and is made such that a dimension of one opening of the through-hole is smaller than a dimension of the other opening of the through-hole, the second surface being opposite to the first surface, the one opening of the through-hole being formed on the first surface, the insulating film having a first side surface perpendicular to the first surface and a second side surface inclined at a predetermined angle of inclination to the first surface, the second side surface being at the one opening of the through-hole; and
    forming a metal portion by conformal plating inside the through-hole having the other opening closed, the metal portion involving therein a void that is closed at the one opening of the through-hole.

11. The semiconductor device manufacturing method according to claim 10, wherein the first side surface and the second side surface are flat surfaces.

12. The semiconductor device manufacturing method according to claim 10, wherein the forming the through-hole comprises
    forming a cylindrical void that penetrates the substrate between the first surface and the second surface,
    covering an inner peripheral surface of the cylindrical void with the insulating film, and
    processing the insulating film to make the through-hole such that the dimension of the one opening is smaller than the dimension of the other opening.

13. The semiconductor device manufacturing method according to claim 10, further comprising forming a first pad on the second surface of the substrate, the first pad being connected to the metal portion.

14. The semiconductor device manufacturing method according to claim 10, further comprising forming a first pad on the second surface of the substrate before forming the through-hole, the first pad being connected to the metal portion.

15. The semiconductor device manufacturing method according to claim 10, further comprising forming a seed film inside the through-hole,
    wherein the metal portion is formed on the seed film.

16. The semiconductor device manufacturing method according to claim 15, further comprising forming a first pad on the second surface of the substrate, the first pad being connected to the metal portion.

17. The semiconductor device manufacturing method according to claim 15, wherein the seed film is formed on the first pad.

18. The semiconductor device manufacturing method according to claim 10, further comprising a bump that is formed on the metal portion.

19. The semiconductor device manufacturing method according to claim 18, wherein the bump is formed on the first surface.

20. The semiconductor device manufacturing method according to claim 1, wherein a first thickness of the insulating film at the one opening of the through-hole is larger than a second thickness of the insulating film at the intermediate portion of the through-hole.

21. The semiconductor device manufacturing method according to claim 10, wherein a first thickness of the insulating film on the second side surface is larger than a second thickness of the insulating film on the first side surface.

* * * * *